United States Patent [19]

Fiedziuszko et al.

[11] Patent Number: 5,204,641
[45] Date of Patent: Apr. 20, 1993

[54] CONDUCTING PLANE RESONATOR STABILIZED OSCILLATOR

[75] Inventors: Slawomir J. Fiedziuszko, Palo Alto; John A. Curtis, Sunnyvale, both of Calif.

[73] Assignee: Space Systems/Loral, Inc., Palo Alto, Calif.

[21] Appl. No.: 849,504

[22] Filed: Mar. 11, 1992

[51] Int. Cl.$^5$ .......................... H03B 5/18; H03B 7/14
[52] U.S. Cl. ................... 331/96; 331/107 DP; 331/107 S; 331/107 SL; 331/117 D
[58] Field of Search ............... 331/96, 107 S, 107 DP, 331/107 SL, 117 D

[56] References Cited

U.S. PATENT DOCUMENTS

| | | | |
|---|---|---|---|
| 3,702,445 | 11/1972 | Forterre | 331/107 SL X |
| 4,149,127 | 4/1979 | Murakami et al. | 331/96 |
| 4,187,476 | 2/1980 | Shinkawa et al. | 331/117 D |
| 4,219,779 | 8/1980 | Shinkawa et al. | 455/321 |
| 4,307,352 | 12/1981 | Shinkawa et al. | 331/99 |
| 4,331,940 | 5/1982 | Uwano | 331/99 |
| 4,348,646 | 9/1982 | Newton et al. | 331/107 SL X |
| 4,481,486 | 11/1984 | Bert et al. | 331/99 |
| 4,494,086 | 1/1985 | Dydyk | 331/107 SL X |
| 4,565,979 | 1/1986 | Fiedziuszko | 331/117 D |
| 4,626,800 | 12/1986 | Murakami et al. | 331/107 SL X |
| 4,749,963 | 6/1988 | Makimoto et al. | 331/99 |

FOREIGN PATENT DOCUMENTS 61-285804 12/1986 Japan .

Primary Examiner—David Mis
Attorney, Agent, or Firm—Edward J. Radlo; Kenneth M. Kaslow

[57] ABSTRACT

A conducting plane resonator (10) is used to stabilize an oscillating means (12) typically operating at microwave frequencies. The conducting plane resonator (10) is in proximity to the oscillating means (12) and is magnetically coupled thereto. In a first implementation, the conducting plane resonator (10) is magnetically coupled to an input conductor (16) of the oscillating means (12). In a second implementation, the conducting plane resonator (10) is magnetically coupled to an output conductor (18), which is coupled to the oscillating means (12). In a third implementation, the conducting plane resonator (10) is magnetically coupled to both the input conductor (16) and the output conductor (18). The conducting plane resonator (10) preferably comprises a thin, substantially planar conducting plane and is dimensioned such that it is resonant at the desired operating frequency. The conducting plane resonator (10) is preferably fabricated of a superconductor material to achieve high-Q performance.

15 Claims, 1 Drawing Sheet

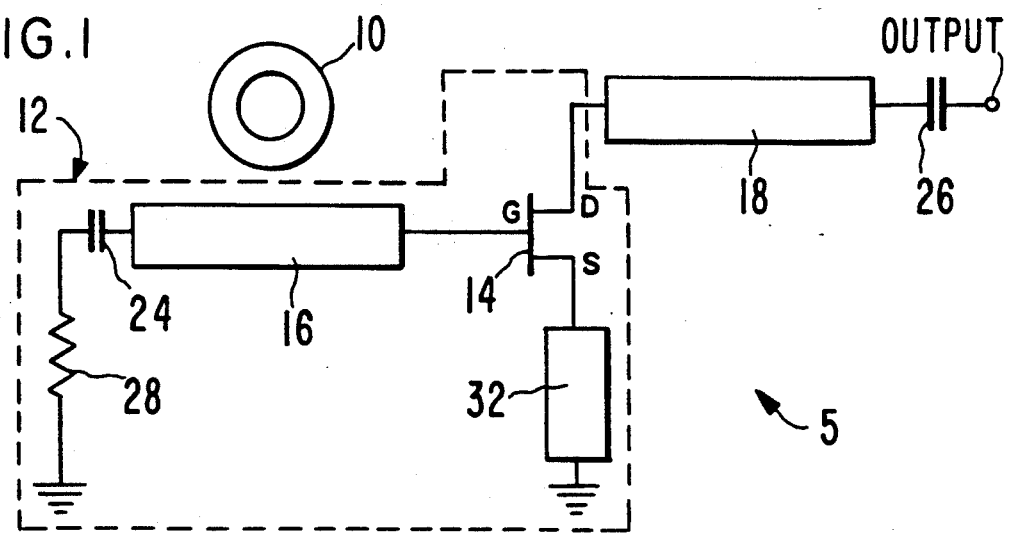
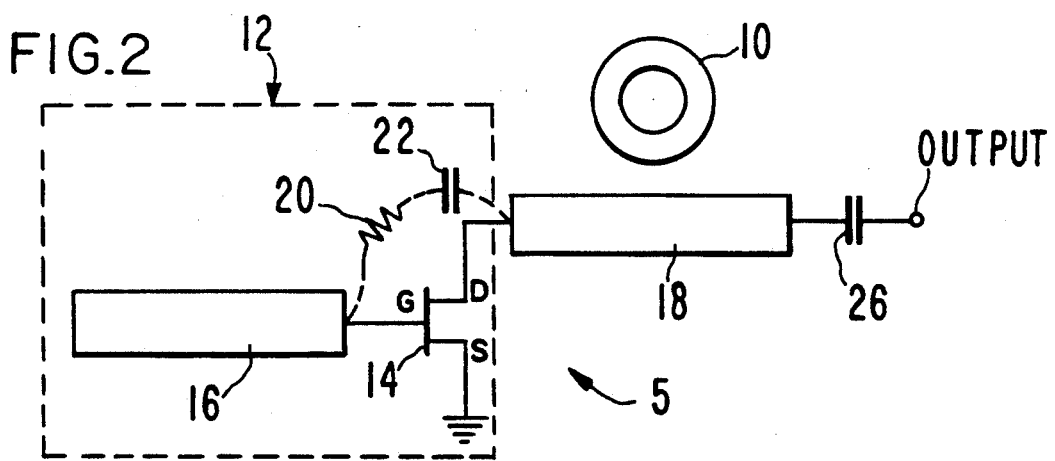
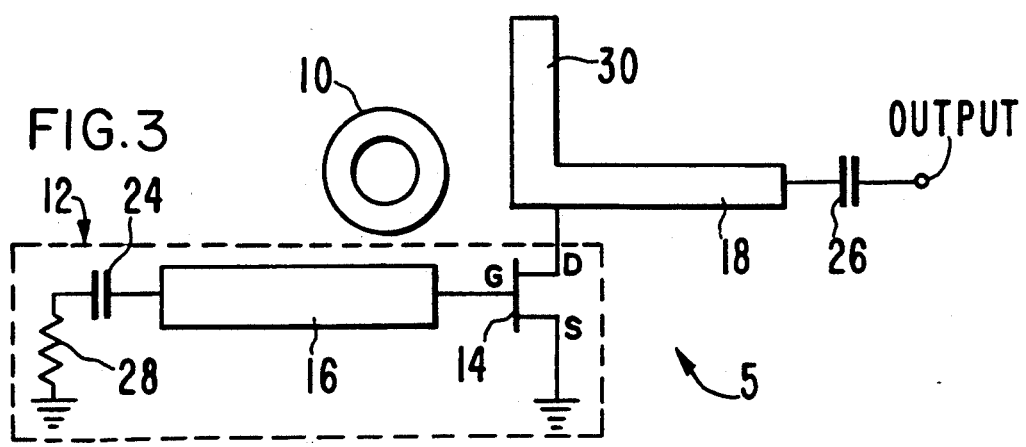

5,204,641

CONDUCTING PLANE RESONATOR STABILIZED OSCILLATOR

BACKGROUND OF THE INVENTION

1. FIELD OF THE INVENTION

The present invention relates to frequency stabilized electronic oscillators, and more particularly to such oscillators having resonators fabricated from a superconducting material for use in applications where small size and light weight are important.

2 DESCRIPTION OF BACKGROUND ART

It is known to use an oscillating means that employs dielectric resonators coupled to an active element to improve stability. Such dielectric resonators provide high-Q performance but are large and heavy. For example, U.S. Pat. No. 4,565,979, issued to Fiedziuszko, discloses a double dielectric resonator tuned by means of a screw. Such a device contains bulky mechanical elements and cannot be fabricated by an integrated circuit process.

Japanese Patent publication 61-285804 discloses an oscillating means that comprises a resonant metallic cavity coupled to the remainder of the oscillating means circuit through two coupling holes. Such a cavity stabilized oscillating means is also large, heavy and expensive to manufacture. Size and weight are critical in space applications, such as satellites. Therefore, the bulky oscillating means described in this publication is not well suited to such applications.

U.S. Pat. No. 4,749,963, issued to Makimoto et al., shows a C-shaped stripline ring structure forming a portion of a stabilizing resonator of an oscillating means. The C-shaped stripline ring is used to provide only the inductive portion of the resonator. The resonator comprises additional capacitive circuitry across the open ends of the C-shaped stripline ring. The insertion of the capacitor results in degraded performance (lower Q). The structure described by Makimoto et al. is, therefore, not suited to superconductor implementation.

Other references are U.S. Pat. Nos. 4,149,127; 4,187,476; 4,219,779; 4,307,352; 4,331,940; and 4,481,486.

DISCLOSURE OF INVENTION

The present invention comprises an oscillating means (12); an output conductor (18) coupled to the oscillating means (12), carrying an RF sinusoid at substantially one frequency; and a thin, substantially planar conducting plane resonator (10) in proximity to the oscillating means (12) and magnetically coupled thereto. The oscillating means (12) may be of the reflection type, the parallel feedback type, or the series feedback type. The resonator (10) comprises a conducting plane which resonates at the desired oscillator frequency. The conducting plane resonator (10) is preferably fabricated of a superconductor material to achieve high-Q performance.

BRIEF DESCRIPTION OF THE DRAWINGS

FIG. 1 is a schematic diagram of a first embodiment of the present invention.

FIG. 2 is a schematic diagram of a second embodiment of the present invention.

FIG. 3 is a schematic diagram of a third embodiment of the present invention.

DETAILED DESCRIPTION OF THE PREFERRED EMBODIMENTS

FIG. 1 illustrates a first embodiment of the present invention. In this embodiment, the conducting plane resonator stabilized oscillator 5 contains an oscillating means 12 of the series feedback type, an output conductor 18 carrying an RF sinusoid at substantially one frequency, a D.C. blocking bias capacitor 26, and a thin, substantially planar conducting plane resonator 10 in proximity to the oscillating means 12 and magnetically coupled thereto.

The oscillating means 12 is a negative impedance device that generates an unstable sinusoidal RF oscillation at substantially one frequency. The oscillating means 12 comprises a D.C. blocking bias capacitor 24, a resistor 28, an input conducting line 16, a gain element 14, and a conducting line 32 to enhance grounding. In the illustrated embodiment, the gain element 14 is a field effect transistor (FET). A reverse channel FET is preferred as the gain element 14 for use in high or medium power applications. The gain element 14 may also be a bipolar transistor, or a negative impedance diode such as a Gunn diode or Impatt diode. In the first embodiment, input conducting line 16 is coupled to the gate of gain element 14 and has a length which produces a negative impedance. Output conducting line 18 is coupled to the drain of the gain element 14. The source of the gain element 14 is coupled to ground by conducting line 32 to enhance R.F. grounding.

The embodiment of FIG. 1 offers the advantage that it is more convenient to couple conducting plane resonator 10 to one conductor 16 instead of to two conductors as in the embodiment of FIG. 3. The FIG. 1 embodiment is less sensitive to output loads than that shown in FIG. 2 because resonator 10 is isolated from the output terminal by the gain element 14.

The conducting plane resonator 10 comprises a planar transmission line. Both the capacitive and inductive portions of the present invention are provided by the distributed capacitance and inductance of conducting plane resonator 10. This approach is particularly suited to superconductor realization where all the conducting lines 10, 16, 18, 32 can be realized using thin film superconductors. Such an entirely superconducting resonator has a significantly higher Q than is possible with C-shaped conducting ring structures.

In the FIG. 1 embodiment, conducting plane resonator 10 is preferably magnetically coupled to input line 16 at a point approximately one-half wavelength (at the desired frequency) from the drain of FET 14. The oscillating means 12 acts as a band stop filter and serves to reflect back a certain amount of power at the resonant frequency of resonator 10. Thus, a high Q open circuit is created at a point along the input conductor 16 determined by the desired output frequency of the oscillating means 12.

For all three embodiments of the conducting plane resonator stabilized oscillator 5, the desired degree of coupling between the conducting plane resonator 10 and the conducting lines 16, 18 and 30 varies according to circuit parameters, including the width of the conducting lines 16, 18 and 30 and the desired frequency of operation.

Referring now to FIG. 2, a second embodiment of the present invention, using a self-oscillating reflection mode, is shown. For ease of understanding, like parts have been labeled with like reference numbers used in FIG. 1. In the second embodiment, the conducting plane resonator stabilized oscillator 5 comprises oscillating means 12, output conductor 18 carrying an RF sinusoid at substantially one frequency, conducting plane resonator 10 in proximity to oscillating means 12 and magnetically coupled to output conductor 18 (and thus indirectly coupled to oscillating means 12), and D.C. blocking bias setting capacitor 26. The oscillating means 12 is a negative impedance device that generates an unstable sinusoidal RF oscillation along output conducting line 18. Oscillating means 12 further comprises an input conducting line 16 and a gain element 14, here a FET, as depicted in FIG. 2. In the FIG. 2 embodiment, an input conducting line 16 is coupled to a gate of the gain element 14 and has a length that will produce a negative impedance. Output conducting line 18 is coupled to the drain of FET 14, whose source is grounded.

The FIG. 2 embodiment shows the use of an optional series L/C circuit 20, 22, coupled between the gate and the drain of the gain element 14, to provide a low-Q feedback path to enhance oscillation. The D.C. blocking bias setting capacitor 26 is between output conductor 18 and the output terminal.

FIG. 3 illustrates a third embodiment of the present invention with a parallel feedback oscillating means 12. The third embodiment preferably comprises a conducting plane resonator 10, an oscillating means 12, an output conducting line 18, a conducting extension 30 used for coupling, and a D.C. bias blocking capacitor 26. Oscillating means 12 and conducting plane resonator 10 are positioned in proximity to each other and are magnetically coupled to each other. The oscillating means 12 is a negative impedance device that generates unstable sinusoidal RF oscillation along input conducting line 16 and output conducting line 18. The oscillating means 12 comprises a gain element 14, an input conducting line 16, a D.C. bias blocking capacitor 24, and a resistor 28.

The gain element 14 is preferably a field effect transistor, as depicted in FIG. 3, a bipolar transistor, or a negative impedance diode, such as a Gunn diode or Impatt diode. When a bipolar transistor is used for device 14, the collector can occupy the place of the drain and the emitter can occupy the place of the source, or vice versa. This type of oscillating means requires that conducting plane resonator 10 be magnetically coupled to the input line 16 as well as to the output line 18 of active device 14. A conducting line 30 used for coupling is connected to the output line 18 to provide a region at the output of device 14 for coupling to conducting plane resonator 10. Coupling between resonator 10 and the input of device 14 is accomplished by means of the magnetic coupling between resonator 10 and input conducting line 16, which is connected to the gate of the illustrated FET 14.

Capacitors 24 and 26 are D.C. blocking bias setting capacitors. They are connected to the ends of the input line 16 and the output line 18, respectively, that are remote from the FET 14. The source of FET 14 is coupled to ground. A resistor 28 couples the blocking capacitor 24 to ground. The resistor 28 preferably has a value equal to the characteristic impedance of input conducting line 16, usually about 50 ohms. A resistor terminated gate assures good out-of-band stability, and prevents the oscillating means 12 from engaging in spurious oscillations and mode jumping. Conducting plane resonator 10 is positioned adjacent to input line 16 and coupling line 30.

The conducting plane resonator 10 of all three embodiments is a planar continuous strip of conducting material which resonates at the desired oscillator frequency, and may be, for example, a circular ring, a rectangular ring, an oval ring, a disk, a square, a rectangle or a grid. Other equivalent geometric structures may also be used. When a ring, preferably the mean circumference of the ring is an integral number of wavelengths at the desired frequency of oscillation. When a rectangle, preferably the long dimension of the rectangle is an integral number of half wavelengths at the desired oscillation frequency. The conducting plane resonator 10 and the conducting lines of the oscillating means 12 are fabricated of thin, substantially planar conductors such as microstrip or stripline. For microstrip circuits, the thin conductor portions 16, 18 and 30 are positioned on a dielectric substrate and spaced apart from an electrically conductive ground plane. For stripline circuits, the thin conductor portions 16, 18 and 30 are sandwiched between two dielectric layers of substantially equal dielectric constant; and the dielectric layers are sandwiched between two electrically conductive ground planes. The conductors are preferably about a mil thick.

To achieve a high Q, resonator 10 is preferably constructed of a superconducting material, such as YBCO, Nb, BiSCCO, or thallium, or some combination thereof. The dielectric substrate is preferably fabricated of a material having a high Q (to focus the output power of the oscillating means over a narrow frequency range), a high temperature stability, and a high dielectric constant to minimize the physical dimensions of the element. Normally, there is an inverse relationship between a material's Q and its dielectric loss tangent. For example, the element may be constructed of Resonics (TM) R-03C or Resonics R-04C, manufactured by Murata Manufacturing Company. R-03C has an unloaded Q of 15,000 and a dielectric constant of 30; it g comprises $Ba(NiTa)O_3-Ba(ZrZnTa)O_3$ with added Perovskite. R-04C has an unloaded Q of 8,000 and a dielectric constant of 37; it consists of $(ZrSn)TiO_4$. Those skilled in the art will appreciate other similar materials.

As with any oscillating means, it is important that the oscillating means 12 be temperature stabilized. To begin with, the material for resonator 10 should be selected, if possible, with built-in temperature compensation to compensate for the fact that the material normally expands with increasing temperature, causing a corresponding frequency shift. When materials for resonator 10 do not have built-in temperature compensation, or when this compensation is inadequate, some additional temperature compensation may be necessary.

This invention has its greatest applicability in conjunction with circuits operating at microwave frequencies, i.e. frequencies higher than 1 GHz, although the range of frequencies for useful operation is much wider.

The above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the invention.

What is claim is:

1. A conducting plane resonator stabilized oscillator comprising:

an oscillating means for producing an RF sinusoid at substantially one frequency, said oscillating means having an input conductor;

coupled to the oscillating means, an output conductor for carrying the RF sinusoid; and a thin, substantially planar conducting plane resonator proximate to the oscillating means and magnetically coupled to the input conductor, for creating a high Q open circuit at a point along the input conductor determined by the desired output frequency of the oscillating means;

wherein the conducting plane resonator is fabricated of a superconductor material.

2. The conducting plane resonator stabilized oscillator of claim 1 wherein the oscillating means further comprises:

a gain element coupled to a first end of the input conductor and to the output conductor; and resistive and capacitive means coupled to a second end of the input conductor.

3. The conducting plane resonator stabilized oscillator of claim 2 wherein the gain element is a field effect transistor (FET).

4. The conducting plane resonator stabilized oscillator of claim 2 wherein the gain element is a bipolar transistor.

5. The conducting plane resonator stabilized oscillator of claim 2 wherein the gain element is a Gunn diode.

6. The conducting plane resonator stabilized oscillator of claim 2 wherein the gain element is an Impatt diode.

7. The conducting plane resonator stabilized oscillator of claim 1 wherein the conducting plane resonator is also magnetically coupled to the output conductor.

8. The oscillator of claim 1 wherein the conducting plane resonator comprises a ring, and the mean circumference of the ring is an integral number of wavelengths at the desired frequency of oscillation.

9. The oscillator of claim 8 wherein the conducting plane resonator comprises a circular ring.

10. The oscillator of claim 8 wherein the conducting plane resonator comprises a rectangular ring.

11. The oscillator of claim 8 wherein the conducting plane resonator comprises an oval ring.

12. The oscillator of claim 1 wherein the conducting plane resonator comprises a disk, and the disk resonates at the desired frequency of oscillation.

13. The oscillator of claim 1 wherein the conducting plane resonator comprises a square.

14. The oscillator of claim 1 wherein the conducting plane resonator comprises a rectangle, and the long dimension of the rectangle is an integral number of half wavelengths at the desired oscillation frequency.

15. The oscillator of claim 1 wherein the conducting plane resonator includes means for structurally generating resonance absent application of a magnetic field.

* * * * *